US008209413B1

(12) United States Patent
Turrichi, Jr. et al.

(10) Patent No.: US 8,209,413 B1
(45) Date of Patent: Jun. 26, 2012

(54) EMERGENCY POWER SETTINGS FOR DATA-CENTER FACILITIES INFRASTRUCTURE EVENT

(75) Inventors: Thomas Edwin Turrichi, Jr., Dallas, TX (US); Troy Miller, Plano, TX (US); Mark A. Chris, McKinney, TX (US); Clifford Mccarthy, Plano, TX (US); Wade J. Satterfield, Fort Collins, CO (US); Phil Prasek, Seattle, WA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 230 days.

(21) Appl. No.: 12/263,245

(22) Filed: Oct. 31, 2008

(51) Int. Cl.
*G06F 15/177* (2006.01)

(52) U.S. Cl. ........ 709/224; 709/223; 709/225; 709/226; 709/229

(58) Field of Classification Search .................. 709/224, 709/223, 225, 226, 229
See application file for complete search history.

(56) References Cited

U.S. PATENT DOCUMENTS

| 7,612,466 | B2* | 11/2009 | Skutt | 307/29 |
|---|---|---|---|---|
| 2001/0052872 | A1* | 12/2001 | Hahlweg | 342/128 |
| 2002/0194329 | A1* | 12/2002 | Alling | 709/224 |
| 2003/0177176 | A1* | 9/2003 | Hirschfeld et al. | 709/203 |
| 2008/0150360 | A1* | 6/2008 | Vezza et al. | 307/31 |
| 2008/0224856 | A1* | 9/2008 | Verma et al. | 340/539.14 |
| 2009/0172432 | A1* | 7/2009 | Morgan et al. | 713/320 |
| 2009/0204667 | A1* | 8/2009 | Diaz et al. | 709/203 |
| 2009/0265568 | A1* | 10/2009 | Jackson | 713/320 |
| 2010/0052872 | A1* | 3/2010 | Boss et al. | 340/310.11 |
| 2010/0083356 | A1* | 4/2010 | Steckley et al. | 726/5 |
| 2010/0281286 | A1* | 11/2010 | Hatasaki et al. | 713/324 |
| 2011/0154087 | A1* | 6/2011 | Craine | 713/340 |

* cited by examiner

*Primary Examiner* — Lan-Dai T Truong

(57) ABSTRACT

A management workstation has an interface for receiving notifications of data-center facilities infrastructure events. A manager determines emergency power settings for managed computing resources in response to the notifications. The settings are then communicated to the resources.

10 Claims, 4 Drawing Sheets

EMERGENCY POWER SETTINGS FOR DATA-CENTER FACILITIES INFRASTRUCTURE EVENT

BACKGROUND OF THE INVENTION

Data centers can be conceptually divided into computing resources and facilities infrastructure. Computing resources can include network equipment, computers, peripherals and other data-handling equipment. Facilities infrastructure can include buildings, power delivery systems (e.g., up to AC outlets), and cooling systems (e.g., room air conditioning systems).

BRIEF DESCRIPTION OF THE DRAWINGS

The figures depict implementations/embodiments of the invention and not the invention itself.

DETAILED DESCRIPTION

The present invention provides for a centralized response to an infrastructure event; the centralized response adjusts power settings for computing resources. For example, in the event of a brown out, power setting can be set to some predetermined minimum that maintains critical workloads at satisfactory performance levels. This reduction in power consumption can extend the time computing equipment can be supported by an uninterruptible power supply (UPS) to ensure adequate time to bring a generator on line. Since the response is centralized, it is not necessary to make power adjustments on a device-by-device basis, thus implementing a data center wide emergency power brake.

Figure 1:
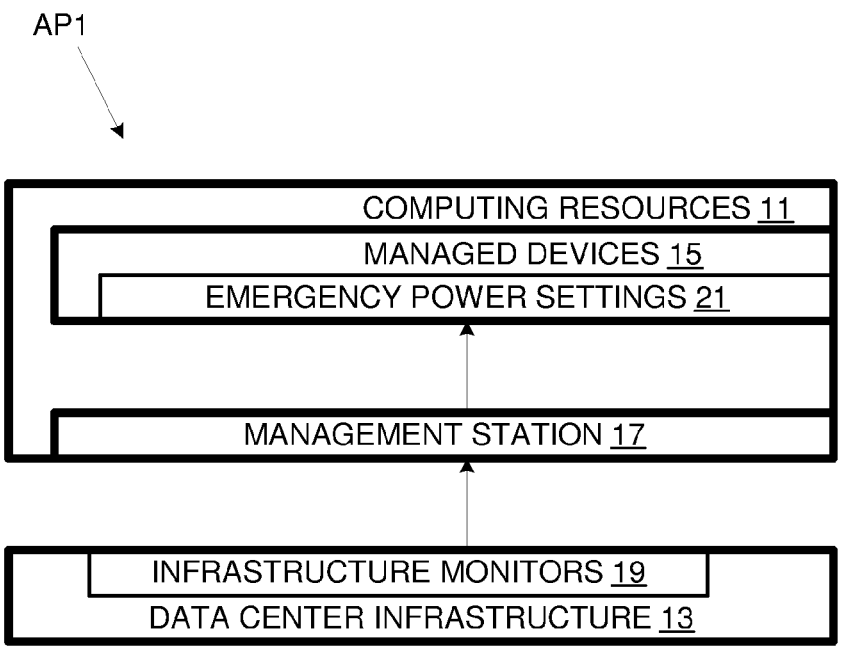
FIG. 1 is a schematic diagram of a data center in accordance with an embodiment of the invention.

A data center AP1 includes computing resources 11 and facilities infrastructure 13, as shown in FIG. 1. Computing resources 11 can include: 1) managed devices 15 with controllable power consumption, and 2) a management station 17 for managing devices 15. Infrastructure 13 includes infrastructure monitors 19 that monitor parameters reflecting the health and effectiveness of infrastructure equipment. Infrastructure monitors 19 detect when an infrastructure event, such as a power or cooling equipment failure occurs. In such a case, monitors 19 notify management station 17 of the event. In response, management station 17 implements emergency power settings 21 of managed devices 15.

Figure 2:
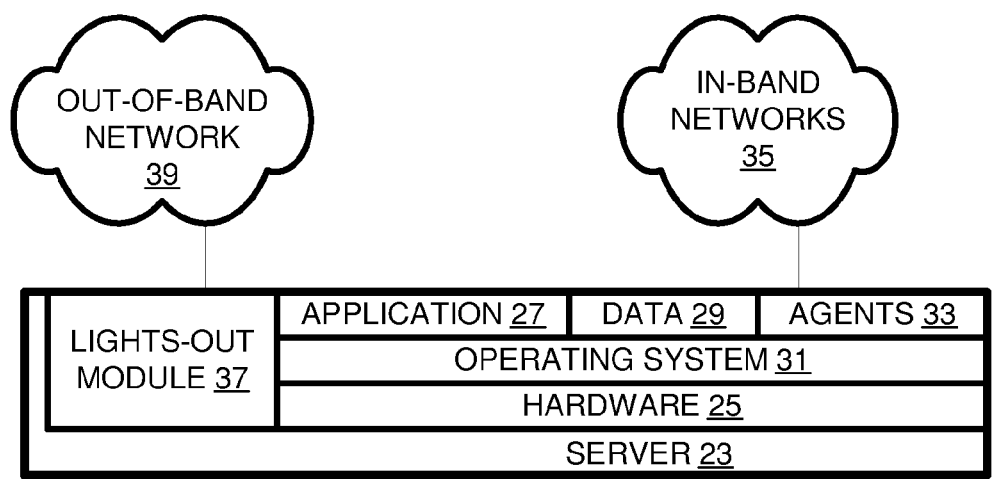
FIG. 2 is a schematic diagram of a server and networks of the data center of FIG. 1.

Managed devices 15 include a server 23, represented in FIG. 2. Server 23 includes hardware 25 on which software (including firmware) is stored and executed. This software includes an application 27 that defines the "mission" of server 23. The software also includes data 29, including data manipulated by application 27 and configuration data including power settings 21 (FIG. 1). In addition, server 23 includes an operating system 31 on which application 27 is run and software agents 33 that provide for centralized management of server 23 over in-band networks 35. Networks 35 are "in band" in that they handle data that is normally visible to operating systems such as operating system 31.

Server 23 also includes a "lights-out" module 37, which is an add-in card that includes its own hardware and software, that provides an "out-of-band" channel for controlling hardware 25. In other words, lights-out module 37 provides for remote control of hardware 25, e.g., its power settings, that bypasses operating system 31. The control is thus operating-system independent so that power settings of data center AP1, which has workloads involving different operating systems, can be controlled using a common interface and protocol.

Figure 3:
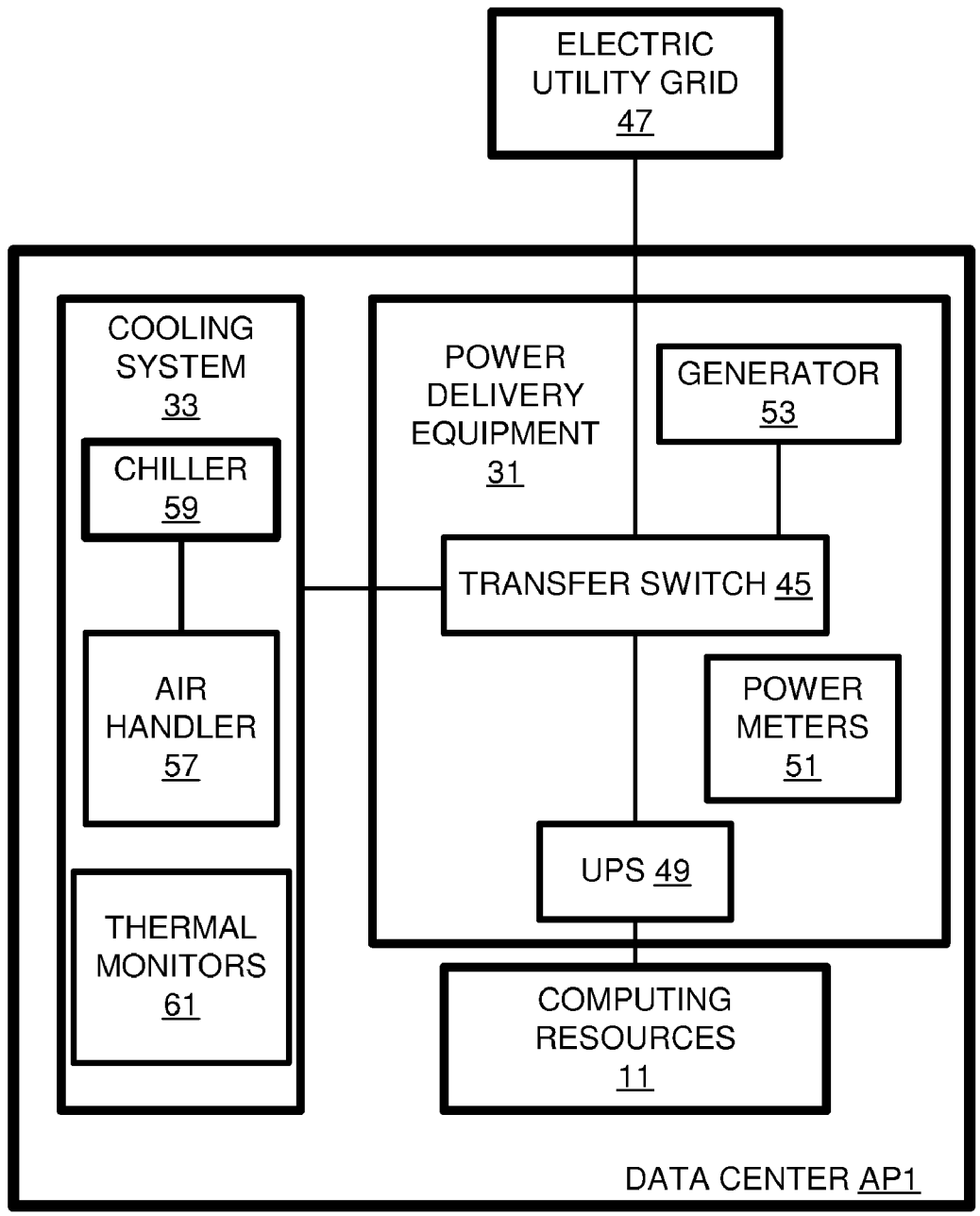
FIG. 3 is a schematic diagram of a facilities infrastructure of the data center of FIG. 1.

Infrastructure 13 can include power delivery equipment 31 and a cooling system 33, as indicated in FIG. 3. Power delivery equipment 31 can include a transfer switch 45 that couples computing resources 11 to an electric power grid 47 through an uninterruptible power supply (UPS) 49. Infrastructure monitors 19 (FIG. 1) include power meters 51 that monitor power consumption by data center AP1 and detect power interruptions, e.g., caused by problems with an external commercial electric utility grid 47. Transfer switch 45 can switch to a generator 53 as a power source if grid 47 fails. UPS 49 provides power in the interim. However, in some cases, a generator can take longer to start than the time UPS 49 can provide interim power. The present invention provides for extending the time UPS 49 can provide interim power by applying an emergency power brake, i.e., immediately reducing power consumption to predetermined emergency power settings 21.

In addition, infrastructure 13 can include cooling equipment 55 including an air handler 57 and a chiller 59. (Power supplies and cooling equipment within computer housings are considered to be computing resources, while power delivery and cooling systems associated with data center facilities are considered part of the infrastructure.) If air handler 55 or chiller 57 fails, heat generated by computing resources 11 may not be removed fast enough to prevent temperature from increasing to unacceptable levels. Infrastructure monitors 19, FIG. 1, include thermal monitors 61 to detect this situation. The present invention provides for applying emergency power settings 21 in response to a thermal ramp to increase the time available for a human intervention before heat damages resources of data center AP1.

Figure 4:
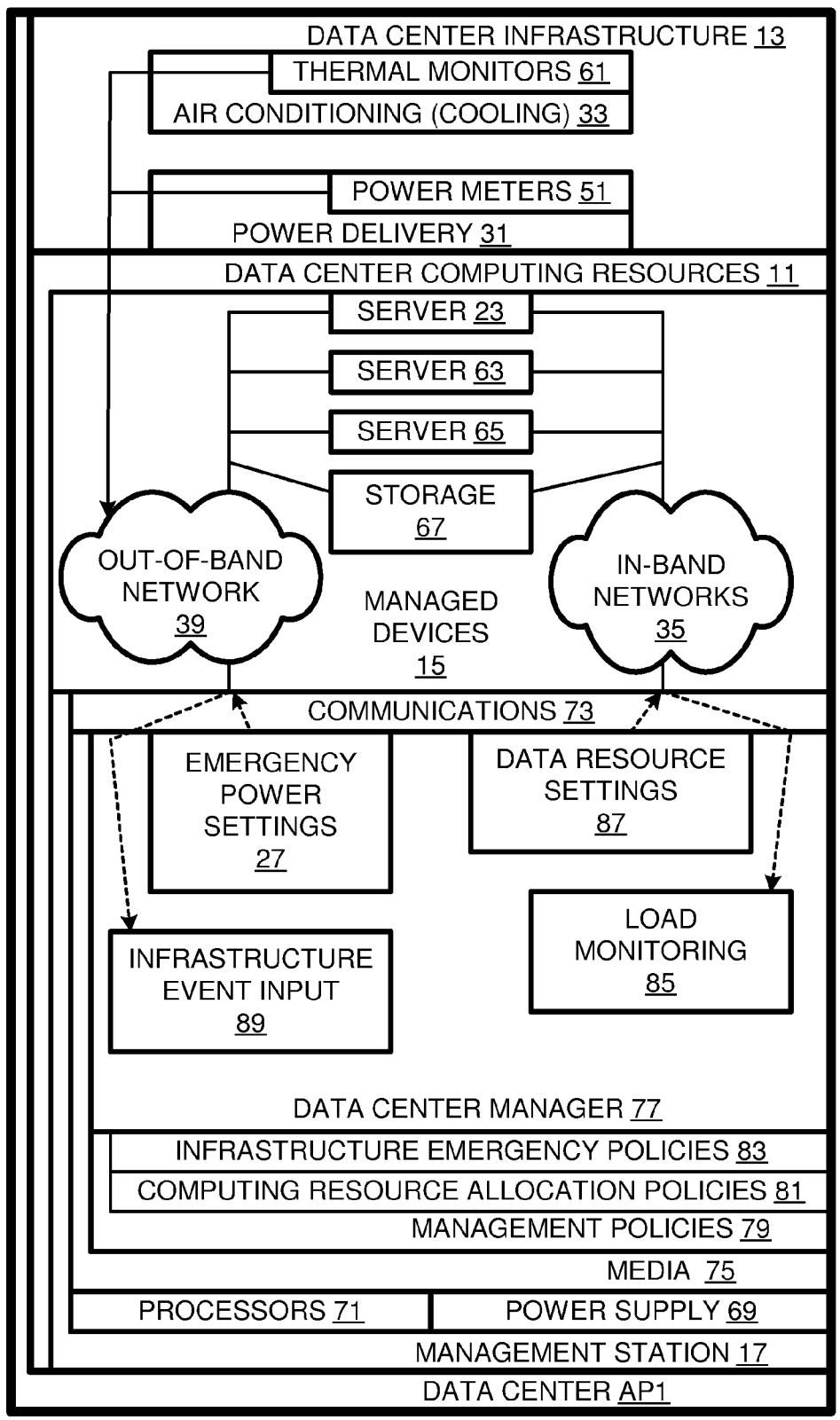
FIG. 4 is a more detailed schematic diagram of the data center of FIG. 1.

Data center AP1 is shown in greater detail in FIG. 4. Infrastructure 13 is shown including power delivery equipment 31 and cooling equipment 33. Monitors 51 and meters 61 are connected to out-of-band network 39, via which they communicate with management station 17, which is a computing resource of data center AP1. In an alternative embodiment, infrastructure monitors communicate with a management station over an in-band network.

Computing resources 11 include a management station 17 and managed devices 15, the latter including servers 23, 63, and 65, and storage devices 67. In addition, network appliances of networks 35 and 39 are managed devices. In data center AP1, management station 17 is not a managed device in the sense that its power and other hardware settings are remotely controlled. In an alternative embodiment, the management station can be a managed device.

Management station 17 includes a power supply 69 (herein, a computing resource rather than infrastructure), processors 71, communications devices 73, and computer-readable storage media 75. Processors 71 execute programs of instructions, including data center manager 77, which is encoded on media 75. Also encoded on media 75 is data including management policies 79 that are referenced by manager 77. Policies 79 include computer-resource allocation policies 81, used during reallocations of resources to workloads. In accordance with the present invention, policies also include infrastructure emergency policies 83, which specify power settings to be assumed in response to an infrastructure emergency.

Data center manager 77 provides for centralized management of data center AP1 in that it receives data at communications devices 73 from infrastructure 13 and managed devices 15, and uses that data to determine resource allocations and power settings. Data center manager 77 can control power settings in two respects: 1) workload management and 2) infrastructure emergency response.

As part of workload management, manager 77 controls power as part of its function in reallocating computing resources to workloads. In determining how to allocate resources to workloads (e.g., software shown running on hardware 25 of server 23), manager 77 can implement computing resource allocation polices that call for shutting down certain resources or reducing the power settings of certain power settings to reduce energy use for conservation and economic reasons. The workload management function involves a load monitoring function 85 that monitors computing loads and other usage parameters. The resulting load data obtained during one allocation period is used to establish data resource settings 87 for the next allocation period. These settings 87 can involve setting power states, e.g., via in-band networks 35, communications devices 73, and agents 33 (FIG. 2). Manager 77 communicates with agents 33 over in-band networks 35.

In its role as an emergency power brake, manager 77 receives notifications of infrastructure emergency and other events from infrastructure 13 at infrastructure event input over out-of-band network 39. Manager 77 determines emergency power settings 27 as a function of infrastructure emergency policies 83. Manager 77 then communicates these settings to the lights-out modules 37 for servers 23, 63, and 65, and storage devices 67. In addition, manager 77 provides to a data center human administrator an interface for manually selecting and triggering implementation of emergency power settings 21.

Manager 77 can use infrastructure emergency policies 83 and out-of-band network 39 for non-emergency events as well. For example, one factor that some electric utilities apply in setting charges for electricity usage may be a peak power, e.g., the highest power usage for any 15-minute period in a month. Under such a pricing scheme, there is a clear financial incentive to limit peak usage. The present invention can be used to monitor power usage, detect excessive usage during the first five or ten minutes of a 15-minute period, and then apply the emergency power brake to clip usage during the remainder of the period.

Figure 5:
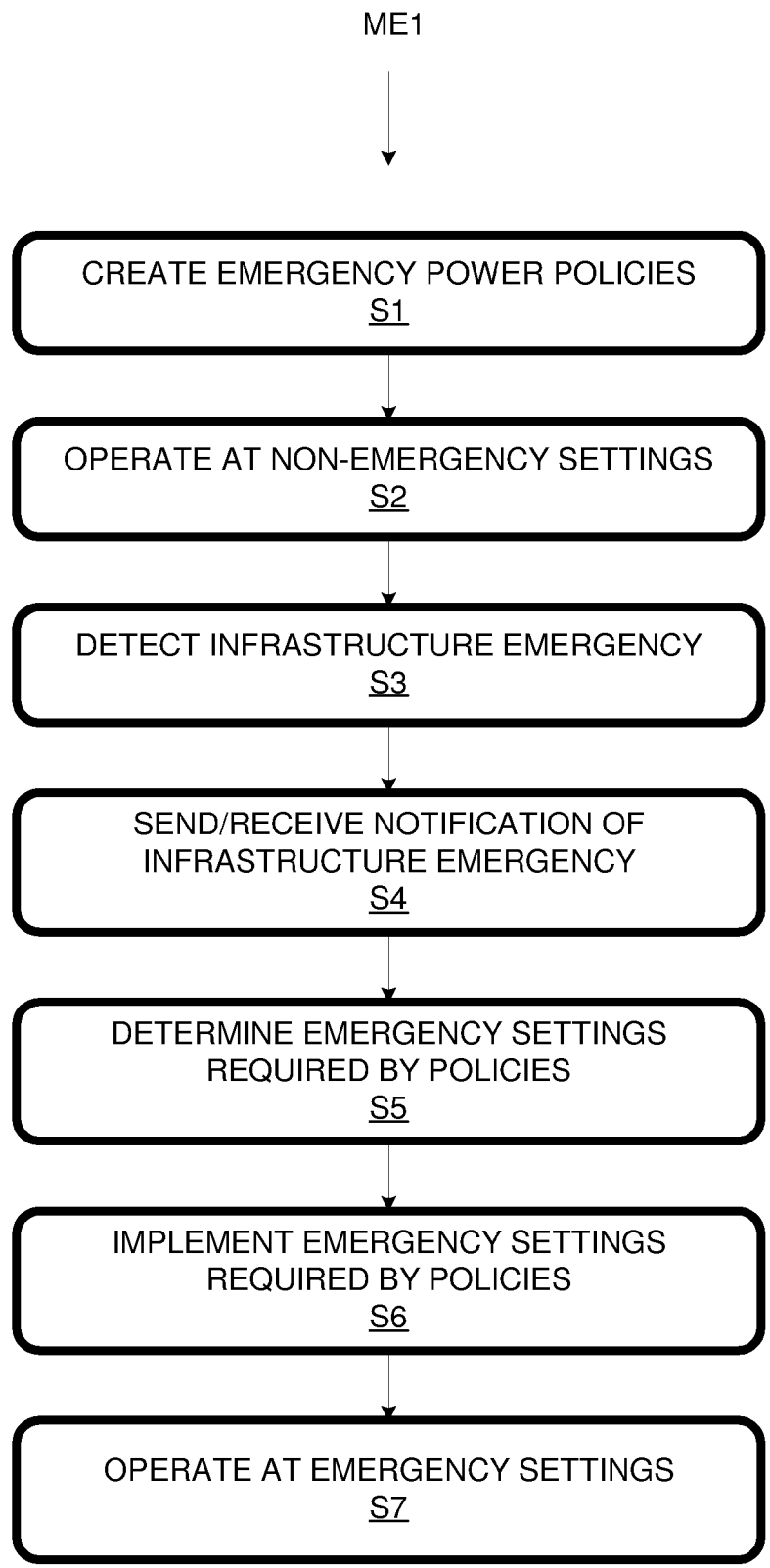
FIG. 5 is a flow chart in accordance with an embodiment of the invention.

The present invention provides for a method ME1 as flow charted in FIG. 5. At step S1, emergency power policies are created. These specify power settings for various infrastructure conditions. At step S2, under normal infrastructure conditions, power settings are determined according to computing-resource allocation policies 81. At step S3, an infrastructure event defined by infrastructure emergency polices 83 is detected, e.g., by monitors 19. At step S4, monitors 19 send and data center manager 77 receives notification of the event. At step S5, in response to the notification of the event, data center manager 77 determines emergency power brake settings 27 as a function of the detected event. At step S6, settings 27 are communicated to lights-out modules 27 of servers 23, 63, 65, and storage 67. At step S7, these managed devices 15 operate at emergency settings 27.

Herein, a "data center" is a system including networks of computing resources along with facilities for housing and maintaining those networks. Herein, "facilities" refers to a room or building along with associated equipment such as equipment (interface with commercial power supply, UPS, generator, transfer switch) for power delivery to the computer networks and equipment (air handlers, chillers) for removing heat generated by the networks from the room or building.

Herein, a distinction is drawn between "mission" applications and data and "management" programs and data. A mission application is an application that defines a purpose of a server. A management program is a program that helps ensure the mission application can operate. For example, a company can use a server to run an accounting application, which then defines a mission for the server. The mission application can be run on an operating system, which is a management program. The accounting program can handle data regarding various accounts; this is mission data. The operating system can implement power settings specified by power settings data; the power settings data is management data.

Herein, an "in-band network" is a network over which mission data and some management data is sent. In-band networks can include primary and back-up data networks as well as storage array networks. An "out-of-band network" is a network that couples a management station (console server) to managed resources. The managed resources typically include an lights-out management module or other remote access card (RAC) which has its own processor, memory, battery, network connection, and access to the system bus (bypassing the operating system on which the mission application is run).

Infrastructure emergency policies 83 can differentiate among event types and also among target resources. For example, the response to a power brown-out can be different from the response to a failed air conditioning system. Also, the response to a failed air condition on a hot day can differ from the response to a failed air conditioner on a cold day. Responses can involve: 1) leaving some (e.g., critical) resources at an "as allocated" power determined by resource allocation policies 81; 2) reducing some devices to a low power level, but leaving them operational; 3) reducing some resources to an idle, dormant, or sleep state; 4) turning off some resources; and 5) reducing the number of servers available to "scale-out" a load where there are many symmetric servers running the same application, e.g., a web server, a database, virtual-machine clusters, etc. Some of this flexibility provided in data center AP1 is represented below in Table I.

TABLE I

Emergency Infrastructure Policies

| Infrastructure Event Type | Server 23 | Server 63 | Server 65 | Storage 67 |
| --- | --- | --- | --- | --- |
| Normal | as allocated | as allocated | as allocated | as allocated |
| Power Outage | as allocated | Low | Idle | Low |
| Brown-out | as allocated | as allocated | Low | Low |
| Cooling Failure (Cool day) | as allocated | Low | Low | Low |
| Cooling Failure (Hot day) | Low | Low | Sleep | Low |
| Peak Limiting | Low | Low | Sleep | Low |

The data in Table 1 is provided for expository purposes to show how power settings can vary according to infrastructure event and according to the device being managed. In other embodiments, there may be many more managed resources and management may be implemented on a finer basis. For example, policies can specify power settings not only for servers as a whole, but for individual processors and cores, memories, communications devices, virtual machines, and workloads. Also, the number of types of power settings can vary by device. For example, memory modules can have different power settings than processors and different types of processors can have different numbers and selections of power settings. Also, a power-off state can be selected for some managed devices.

As Table I demonstrates, not all servers need be treated equally. Policies can be set to determine how to treat each server. Alternatively, each server can be assigned to a class of service, and policies can be set per service class. The policies can specify what events trigger which responses and can permit manual triggering of an emergency power brake response. The invention provides for different mechanisms (shedding load, dropping servers, into low-power states, turning off cells or other components, and scaling back clustered applications) for applying emergency-power brake policies to servers. The present invention can be implemented for servers having internal-lights-out modules and those without. Both in-band and out-of-band networks can be used to effect the emergency brake. These and other variations upon and modifications to the illustrated embodiment are provided by the present invention, the scope of which is defined by the following claims.

What is claimed is:

1. A system comprising:
    a management workstation configured to manage a data center having a facilities infrastructure and servers, said servers having computing resources including processors, memories and communications devices for executing critical and non-critical software workloads, said management workstation having:
        hardware communications devices;
        a processor;
        non-transitory storage media encoded with code that, when executed by said processor, defines a workload manager to, in response to at least one notification received via said hardware communications devices of an emergency event regarding a power-delivery or cooling system of said facilities infrastructure, cause a reallocation of said computing resources to said critical and non-critical software workloads by communicating emergency power settings to said servers via said hardware communication devices and a first network so as to reduce overall power consumption while said critical software workloads continue to execute;
    an in-band network normally visible to workloads, said first network being an out-of-band network that bypasses said workloads, said management workstation communicating said emergency power settings to said servers over said out-of-band network; and
    a managed server executing a workload including a mission application on an operating system, said managed server having server power settings, said managed server having an integrated lights-out module connected to said out-of-band network so that said management workstation can change said server power settings by communicating them through said operating system.

2. A system as recited in claim 1 further comprising said data center, said facilities infrastructure including said power delivery system, said power-deliver system being coupled to a commercial electric utility, said facilities infrastructure event being caused by a failure of said commercial electric utility to provide a certain level of power to said data center.

3. A system as recited in claim 1 further comprising said facilities infrastructure, said facilities infrastructure including a cooling system, said facilities infrastructure event being caused by a failure of a component of said cooling system.

4. A method comprising:
    a management workstation managing a data center including facilities infrastructure and servers not belonging to said facilities infrastructure, said servers executing critical workloads and non-critical workloads, said servers having computing resources including processors, memories, and communications devices for executing critical and non-critical software workloads;
    the management workstation receiving notification of an emergency event regarding at least one of a power-delivery system or a cooling system of said facilities infrastructure; and
    said management workstation causing a reallocation of said computing resources to said critical and non-critical software workloads at least in part by communicating emergency power settings over an out-of-band network that bypasses workloads to lights-out modules of said servers over a first network so that power consumed by said data center is reduced while said critical software workloads continue to execute.

5. A method as recited in claim 4 wherein said emergency event involves a facilities infrastructure failure, said notification referring to said facilities infrastructure failure.

6. A method as recited in claim 5 wherein said failure relates to power delivery equipment or cooling equipment of said facilities infrastructure.

7. A method as recited in claim 4 further comprising:
    in response to a failure of said power-delivery system, starting up a power generator for providing power to said servers; and
    while said power generator is starting up, providing power to said servers using at least one uninterruptible power supply, workload manager causing said servers to maintain said emergency power settings while said power generator is starting up.

8. A computer product comprising non-transitory computer-readable storage media encoded with code configured to define:
    facilities-infrastructure event policies specifying emergency power settings to be applied to managed servers for executing critical and non-critical software workloads of a data center upon detection of a data-center facilities infrastructure event regarding a power-delivery system or a cooling system of a facilities infrastructure; and
    a workload manager configured to, when executed by a processor, receive a notification of said facilities infrastructure event and reallocate computing resources of said managed servers to said critical and non-critical software workloads at least in part by communicating emergency power settings over an out-of-band network that bypasses workloads to lights-out modules of said managed servers, said emergency power settings being configured to reduce power consumption by said managed servers while permitting said critical software workloads to continue executing, said workload manager also communicates with said managed servers over an in-band network separate from said out-of-band network.

9. A computer product as recited in claim 8 wherein said facilities infrastructure event is a power failure.

10. A computer product as recited in claim 8 wherein said facilities infrastructure event is a failure of a data-center cooling system leading to a temperature ramp at said managed servers.

* * * * *

UNITED STATES PATENT AND TRADEMARK OFFICE
CERTIFICATE OF CORRECTION

PATENT NO. : 8,209,413 B1
APPLICATION NO. : 12/263245
DATED : June 26, 2012
INVENTOR(S) : Thomas Edwin Turicchi, Jr. et al.

It is certified that error appears in the above-identified patent and that said Letters Patent is hereby corrected as shown below:

Title Page, item (12) and (75);

In the first inventor's name: "Turrichi" should be "Turicchi".

In the third inventor's name: "Chris" should be "Criss".

Signed and Sealed this
Eighteenth Day of September, 2012

David J. Kappos
*Director of the United States Patent and Trademark Office*